(12) United States Patent
Minami et al.

(10) Patent No.: US 11,252,813 B2
(45) Date of Patent: Feb. 15, 2022

(54) MULTILAYER CIRCUIT BOARD FILTER

(71) Applicant: PANASONIC INTELLECTUAL PROPERTY MANAGEMENT CO., LTD., Osaka (JP)

(72) Inventors: Yoshihisa Minami, Shiga (JP); Takuya Ishii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 92 days.

(21) Appl. No.: 16/533,643

(22) Filed: Aug. 6, 2019

(65) Prior Publication Data
US 2019/0364657 A1   Nov. 28, 2019

Related U.S. Application Data

(63) Continuation of application No. PCT/JP2018/004506, filed on Feb. 9, 2018.
(Continued)

(51) Int. Cl.
*H05K 1/00* (2006.01)
*H05K 1/18* (2006.01)
(Continued)

(52) U.S. Cl.
CPC ......... *H05K 1/0233* (2013.01); *H03H 7/0115* (2013.01); *H05K 1/181* (2013.01)

(58) Field of Classification Search
CPC .... H05K 1/0233; H05K 1/181; H03H 7/0115; H03H 7/427; H03H 1/00; H03H 2001/0085; H03H 7/09
See application file for complete search history.

(56) References Cited

U.S. PATENT DOCUMENTS

| 5,714,794 A | 2/1998 | Tsuyama et al. |
| 5,915,757 A | 6/1999 | Tsuyama et al. |

(Continued)

FOREIGN PATENT DOCUMENTS

| JP | H04-035512 A | 2/1992 |
| JP | H08-167522 A | 6/1996 |

(Continued)

OTHER PUBLICATIONS

Office Action dated Sep. 17, 2019 issued in corresponding Japanese Patent Application No. 2018-242839.
(Continued)

*Primary Examiner* — Yuriy Semenenko
(74) *Attorney, Agent, or Firm* — McDermott Will and Emery LLP

(57) ABSTRACT

An advantageous effect of a low-pass filter that reduces high-frequency noise can be obtained by including an input terminal that extends from a front surface to a rear surface of a multilayer circuit board including a double-sided circuit board; a first wiring conductor having an end connected to the input terminal on the rear surface of the multilayer circuit board; a first via that extends from an other end of the first wiring conductor to the front surface of the multilayer circuit board; a second wiring conductor having an end connected to the first via on the front surface of the multilayer circuit board; and a first input capacitor disposed on the second wiring conductor; by being conductive due to the input terminal and the first via being configured in series; and including the first input capacitor.

3 Claims, 11 Drawing Sheets

Related U.S. Application Data

(60) Provisional application No. 62/457,515, filed on Feb. 10, 2017.

(51) Int. Cl.
*H05K 7/00* (2006.01)
*H05K 1/02* (2006.01)
*H03H 7/01* (2006.01)

(56) References Cited

U.S. PATENT DOCUMENTS

| | | | | |
|---|---|---|---|---|
| 7,161,784 | B2 | 1/2007 | Cheung et al. | |
| 2004/0008531 | A1* | 1/2004 | Arai | H05K 1/0233 363/144 |
| 2006/0274472 | A1* | 12/2006 | Saito | H01G 4/35 361/118 |
| 2007/0075696 | A1* | 4/2007 | Mitsui | H05K 1/0233 323/282 |
| 2009/0033439 | A1* | 2/2009 | Igarashi | H03H 7/0115 333/185 |
| 2012/0039010 | A1* | 2/2012 | Tresness | H05K 1/026 361/112 |
| 2012/0319801 | A1* | 12/2012 | Taniguchi | H03H 7/1791 333/185 |
| 2015/0173174 | A1* | 6/2015 | Wei | H05K 1/0231 361/782 |
| 2017/0086289 | A1* | 3/2017 | Takahashi | H02M 1/14 |
| 2017/0231085 | A1* | 8/2017 | Otsubo | H05K 1/165 |
| 2020/0228086 | A1* | 7/2020 | Akiyama | H03F 3/245 |

FOREIGN PATENT DOCUMENTS

| | | |
|---|---|---|
| JP | H09-007730 A | 1/1997 |
| JP | H09-205021 A | 8/1997 |
| JP | 2000-31772 A | 1/2000 |
| JP | 2002-175921 A | 6/2002 |
| JP | 2004-335805 A | 11/2004 |
| WO | 2005/060092 A1 | 6/2005 |
| WO | 2015/162656 A1 | 10/2015 |
| WO | 2016/047316 A1 | 3/2016 |

OTHER PUBLICATIONS

Decision of Refusal dated Mar. 24, 2020 issued for the corresponding Japanese Patent Application No. 2018-242839; with English translation.

International Search Report and Written Opinion dated Apr. 24, 2018 in International Application No. PCT/JP2018/004506; with partial English translation.

* cited by examiner

MULTILAYER CIRCUIT BOARD FILTER

CROSS REFERENCE TO RELATED APPLICATIONS

This application is a U.S. continuation application of PCT International Patent Application Number PCT/JP2018/004506 filed on Feb. 9, 2018, claiming the benefit of priority of U.S. Provisional Patent Application No. 62/457,515 filed on Feb. 10, 2017, the entire contents of which are hereby incorporated by reference.

BACKGROUND

1. Technical Field

The present disclosure relates to a filter that is disposed on a multilayer circuit board on which an electronic circuit is mounted, and in particular to a multilayer circuit board filter that reduces high-frequency noise from a power-supply line, ground line, and the like.

2. Description of the Related Art

In recent years, multilayer circuit boards that are stacked insulating substrates on which wiring conductors such as copper foil are applied by printing, etc. have been used for making electronic equipment smaller. In multilayer circuit boards, electronic circuits are generally formed by using conductor-equipped through-holes called vias for the connections between wiring conductors in different layers, and due to various components mounted on the front surface or rear surface of the multilayer circuit board being connected to each other through the wiring conductors, vias, etc. Such wiring conductors or vias, but each include, while microscopic, a parasitic inductor, and as illustrated in PCT International Patent Application Publication No. WO2015-162656, a technique has been conceived that makes use of the parasitic inductors of the wiring conductors, the vias, etc. as components of a filter.

FIG. 15 is a cross-sectional view of multilayer printed circuit board (PCB) 300 mentioned in PCT International Patent Application Publication No. WO2015-162656. In FIG. 15, an input power-supply line from a surface mount connector 107 extends through via 310, an inner layer wiring conductor 307, and vias 311 to 313 to a rear surface wiring conductor 309. Wiring conductor 309 is connected to capacitor 103 and extends through vias 314 to 316, an inner layer wiring conductor 306, and vias 317 to 319 to a front surface wiring conductor 305 and a rear surface wiring conductor 308. The front surface wiring conductor 305 is connected to capacitor 104 and load 105. The rear surface wiring conductor 308 is connected to capacitor 109. As stated above, the power-supply line from connector 107 is connected to capacitor 103 and includes a π filter connected to capacitor 104 through the parasitic inductors included in vias 314 to 316, the inner layer wiring conductor 306, and vias 317 to 319.

The filter formed on the above multilayer PCB includes wide wiring conductors with the same potential in each inner layer (in FIG. 15, wiring conductors 306 and 307) for reducing wiring impedance and power loss. These wide wiring conductors have an electrostatic capacitance between the front surface layer and the rear surface layer, and lose their low-pass filter (LPF) properties since the parasitic inductors of the vias and the like are bypassed at higher frequencies.

The parasitic inductor of one via depends on a size and shape thereof, but does not normally satisfy 1 nH. When expecting the advantageous effects from the filter using this parasitic inductor, one needs to increase the number of vias in series, increase the capacitance of the capacitors, etc. Increasing the capacitance of the capacitors, however, also means increasing the required circuit board area.

A value of the parasitic inductance is, for example, stated by the following formula in PCT International Patent Application Publication No. WO2015-162656 expressing the inductance of the wiring conductors.

$$0.0002Lp[\ln\{2Lp/(Wp+Hp)\}+0.2235\{(Wp+Hp)/Lp\}+0.5] \, (\mu H)$$

Lp indicates the length of the conductor, Wp the width of the conductor, and Hp the thickness of the conductor.

Since $\ln\{2Lp/(Wp+Hp)\}$ is the dominant portion in the formula, the parasitic inductance can be increased by making the wiring conductors long and narrow. Making the wiring conductors narrower, however, increases electric resistance and causes a drop in efficiency. Making the wiring conductors longer also means increasing the required circuit board area.

In view of the above problem, the present disclosure aims to provide a multilayer circuit board filter that more effectively uses the parasitic inductors of the vias and can be formed with a small required circuit board area.

SUMMARY

In order to solve the above problem, a multilayer circuit board filter according to an aspect of the present disclosure includes an input terminal that extends from a front surface to a rear surface of a multilayer circuit board having at least two wiring layers; a first wiring conductor having an end connected to the input terminal on the rear surface of the multilayer circuit board; a first via that extends from an other end of the first wiring conductor to the front surface of the multilayer circuit board; a second wiring conductor having an end connected to the first via on the front surface of the multilayer circuit board; and an output capacitor disposed on the second wiring conductor.

The multilayer circuit board filter according to the present disclosure makes it possible to configure a filter that effectively uses the parasitic inductors of the vias and can be formed with a small required circuit board area.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments will be concretely described with reference to the drawings.

Note that each of the embodiments described below shows a comprehensive or specific example in the present disclosure. Numerical values, shapes, materials, components, placement and connection of the components, and the like are mere examples and are not intended to limit the present disclosure. Components in the following embodiments not mentioned in any of the independent claims that define the broadest concepts are described as optional elements.

Embodiment 1

Hereinafter, a multilayer circuit board input filter according to Embodiment 1 will be described with reference to the drawings.

Figure 1A:
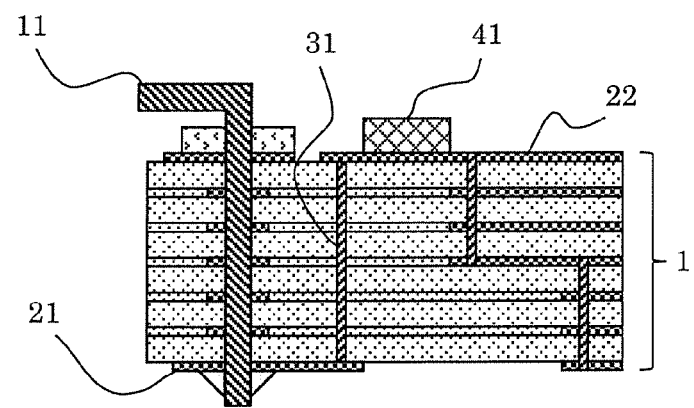
FIG. 1A is a cross-sectional view showing a configuration example of a multilayer circuit board input filter according to Embodiment 1.
Figure 1B:
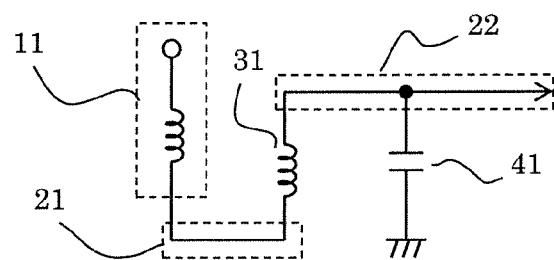
FIG. 1B is a diagram showing an equivalent circuit for describing electrical properties of the input filter in FIG. 1A.

FIG. 1A is a cross-sectional view showing a configuration example of the multilayer circuit board input filter according to Embodiment 1. FIG. 1B is a diagram showing an equivalent circuit for describing electrical properties of the input filter in FIG. 1A.

The input filter in FIG. 1A is a filter circuit formed on multilayer circuit board 1, and includes input terminal 11, first wiring conductor 21, first via 31, second wiring conductor 22, and first input capacitor 41. This input filter, for example, (i) is a low-pass filter (LPF) that inputs a power-supply voltage supplied by multilayer circuit board 1 and reduces noise included in the power-supply voltage, and (ii) supplies the noise-reduced power-supply voltage to another circuit in multilayer circuit board 1.

Multilayer circuit board 1 (i) has a configuration in which insulating substrates including wiring conductors such as copper foil are stacked, (ii) and includes at least two wiring layers.

Input terminal 11 is inserted in a mounting hole from a front surface to a rear surface of multilayer circuit board 1. Input terminal 11 receives the power-supply voltage from, for example, a power-supply apparatus.

First wiring conductor 21 is printed on the rear surface of multilayer circuit board 1 and has an end soldered to input terminal 11.

First via 31 is disposed on an other end of first wiring conductor 21 on the rear surface of multilayer circuit board 1 and passes through the front surface of multilayer circuit board 1.

Second wiring conductor 22 is printed on the front surface of multilayer circuit board 1 and has an end connected to first via 31.

First input capacitor 41 includes first and second electrodes, the first electrode is connected to second wiring conductor 22, and the second electrode is grounded. Via first input capacitor 41, second wiring conductor 22 is wired to other inner layer wiring conductors through inner circuits, other vias, and the like. Input terminal 11 and first via 31 each include a parasitic inductor, and as illustrated in the equivalent circuit of FIG. 1B, an LC filter is formed by the parasitic inductors and first input capacitor 41.

Conductors disposed vertically in multilayer circuit board 1 such as input terminal 11 and first via 31 can each include a parasitic inductor in a smaller area than wiring conductors disposed on a horizontal surface such as the front surface, rear surface and inner layers of multilayer circuit board 1. When multilayer circuit board 1 includes an input filter as in Embodiment 1, an inductor with inductance of several nH can be formed by intentionally configuring input terminal 11 and first via 31 in series. When, for example, handling a comparatively large amount of electric power of, for example, a power supply, multilayer circuit board 1 is thicker than general 1.6 mm circuit boards. When the thickness of multilayer circuit board 1 is 3 mm, the inductors in series included in input terminal 11 and first via 31 have an inductance of 5 nH. When the electrostatic capacitance of first input capacitor 41 is 1000 pF, cutoff frequency fc is $$fc=1/(2\times\pi\times\sqrt{(5\ nH\times 1000\ pF)})\approx 70\ MHz$$

and an LPF can be obtained that reduces high-frequency noise.

Since input terminal 11 requires mechanical strength for being a connector, the footprint thereof is bigger than compared to other surface-mount devices (SMDs) because input terminal 11 has a structure for supporting the conductors. In the case of the present embodiment, it is possible to dispose first via 31 proximate to a support structure of input terminal 11. In other words, it is possible to form a filter while hardly increasing the footprint.

The area of the wiring conductors tends to be increased in order to reduce conduction loss, but at higher frequencies, noise may propagate itself due to parasitic capacitance between the insulating substrates and the filter loses its advantageous effects. By connecting first via 31 to the end of first wiring conductor 21 and the end of second wiring conductor 22 as in the present embodiment, it is possible to greatly reduce wiring conductor areas facing each other with the insulating substrate therebetween, and to reduce the parasitic capacitance.

In the input filter in the present embodiment, since current is collected at the electrodes of second wiring conductor 22 and first input capacitor 41 disposed on the front surface of the multilayer circuit board and the current is then wired to the other inner layer wiring conductors through the inner circuits, others vias, and the like, high-frequency noise from first input capacitor 41 can be sufficiently reduced.

Note that in the present embodiment, input terminal 11 and first via 31 are connected with first wiring conductor 21 on the rear surface of multilayer circuit board 1, but when the inner layers are sufficiently thick for securing a desired parasitic inductance, input terminal 11 and first via 31 may also be connected with a wiring conductor disposed on those inner layers.

When disposing input terminal 11 and first via 31 proximate to each other, first wiring conductor 21 is shorter and the inductance value tends to be lower, thus contributes little to the overall inductance value. In contrast, when input terminal 11 and first via 31 may be disposed farther from each other for configurational reasons such as component placement, the inductance value can be increased by disposing first wiring conductor 21 long and narrow.

As described above, the filter according to Embodiment 1 includes input terminal 11 that extends from the front surface to the rear surface of multilayer circuit board 1 having at least two wiring layers; first wiring conductor 21 having an end connected to input terminal 11 on the rear surface of multilayer circuit board 1; first via 31 that extends from an other end of first wiring conductor 21 to the front surface of multilayer circuit board 1; second wiring conductor 22 having an end connected to first via 31 on the front surface of multilayer circuit board 1; and input capacitor 41 disposed on second wiring conductor 22.

This configuration makes it possible to actively have mainly input terminal 11 and first via 31 each include a parasitic inductor, and to configure the filter to hardly increase the footprint due to these parasitic inductors and the input capacitor. The parasitic capacitance is low since there are hardly any opposing sheet-shaped wiring patterns, and since the flowing current is collected in second wiring conductor 22 connected to a terminal of first input capacitor 41, the filter can reduce noise exceedingly effectively.

Embodiment 2

Figure 2:
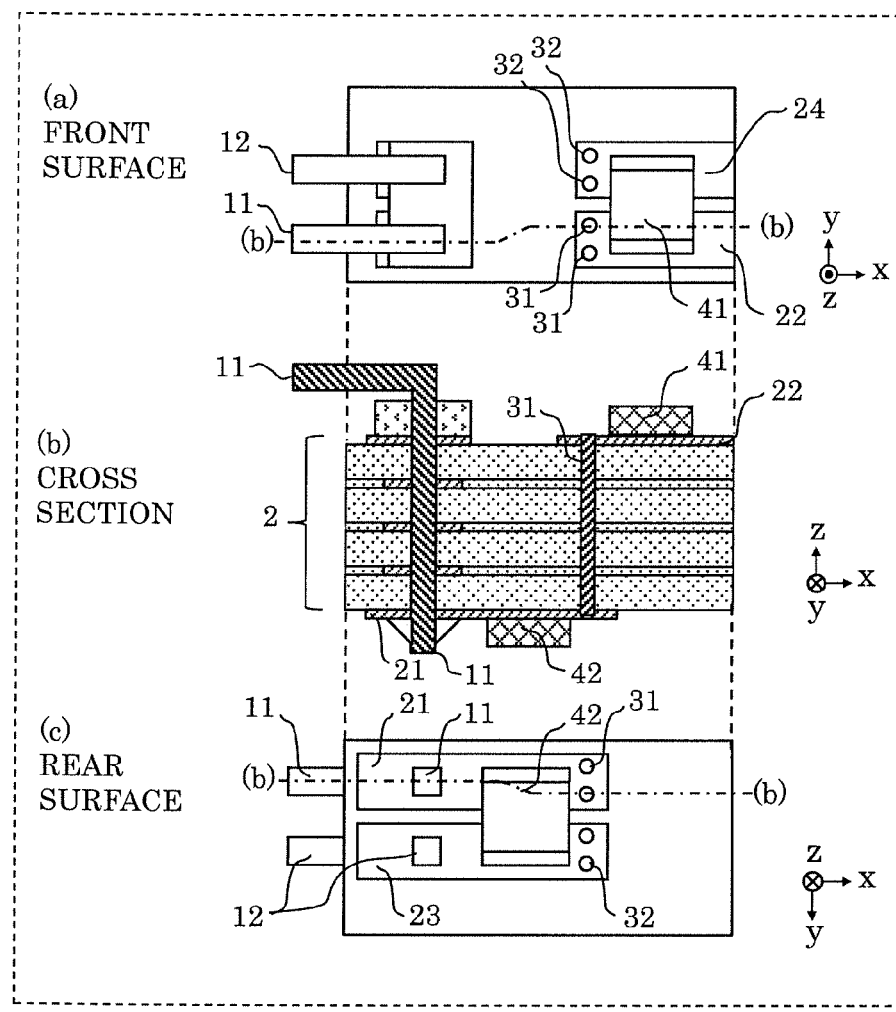
FIG. 2 is a diagram showing (a) front surface, (b) cross section, and (c) rear surface of a multilayer circuit board input filter according to Embodiment 2.
Figure 3:
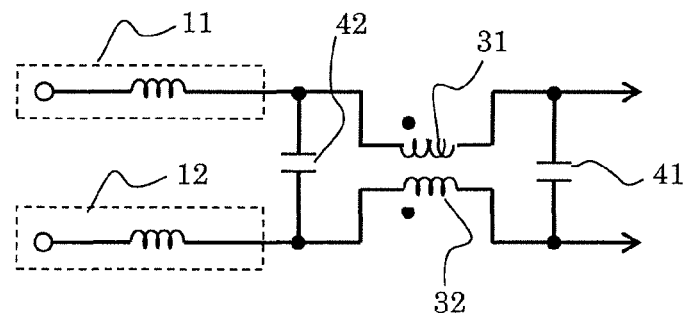
FIG. 3 is a diagram showing an equivalent circuit of the multilayer circuit board input filter according to Embodiment 2.

FIG. 2 is a diagram showing (a) front surface, (b) cross section, and (c) rear surface of a multilayer circuit board input filter according to Embodiment 2. (b) in the drawing is a cross section along dash-dotted line (b)-(b) shown in (a) front surface and (c) rear surface. FIG. 3 is a diagram showing an equivalent circuit for describing electrical properties of the input filter. The multilayer circuit board input filter in Embodiment 1 shown in FIG. 1 has a configuration in which one input line is applied thereto, but Embodiment 2 relates to a pair of two input lines, a power-supply line and a ground line. In FIG. 2, the power-supply line is the same as in the multilayer circuit board input filter according to Embodiment 1 shown in FIG. 1 and is therefore given the same reference numeral.

Note that the multilayer circuit board in Embodiment 2 is named multilayer circuit board 2 to distinguish between the multilayer circuit board in FIG. 1. Second input capacitor 42 is connected to first wiring conductor 21.

The input filter in FIG. 2 is a filter circuit formed on multilayer circuit board 2, and includes input terminal 11, first wiring conductor 21, first via 31, second wiring conductor 22, and first input capacitor 41 as components of the power-supply line. This input filter further includes GND input terminal 12, second wiring conductor 22, first GND via 32, first GND wiring conductor 23, second GND wiring conductor 24, and second input capacitor 42 as components of the ground line. Hereinafter, in order to clearly distinguish the components of the power-supply line, input terminal 11 will be referred to as power input terminal 11, first wiring conductor 21 as first power wiring conductor 21, first via 31 as first power via 31, and second wiring conductor 22 as second power wiring conductor 22.

The input filter in FIG. 2 differs from the input filter in FIG. 1 in that the components of the ground line have been added. Hereinafter, the differences therefrom will be mainly described.

GND input terminal 12 is inserted in a mounting hole from a front surface to a rear surface of multilayer circuit board 2.

First GND wiring conductor 23 is a third wiring conductor, is printed on the rear surface of multilayer circuit board 2, and has an end soldered to GND input terminal 12.

First GND via 32 is disposed on an other end of first GND wiring conductor 23 on the rear surface of multilayer circuit board 2 and passes through the front surface of multilayer circuit board 2.

Second GND wiring conductor 24 is a fourth wiring conductor, is printed on the rear surface of multilayer circuit board 2, and has an end connected to first GND via 32.

First input capacitor 41 is the first input capacitor, includes first and second electrodes, the first electrode is connected to second wiring conductor 22, and the second electrode is grounded by second GND wiring conductor 24. Via first input capacitor 41, second GND wiring conductor 24 is wired to other inner layer wiring conductors through inner circuits, other vias, and the like. In Embodiment 2, second input capacitor 42 is disposed, the first electrode of second input capacitor 42 is connected to first power wiring conductor 21, and the second electrode is connected to first GND wiring conductor 23. It will described later with reference to FIG. 3, but input GND terminal 12 and first GND via 32 each include a parasitic inductor, and a n filter is formed by first input capacitor 41, first power via 31, first GND via 32, and second input capacitor 42. In FIG. 2, first power via 31 and first GND via 32 are each disposed twice, but may be configured accordingly depending on the relationship between the ampacity of the vias and how high the current actually flowing therethrough is.

The above configuration enables the multilayer circuit board filter in Embodiment 2 to be expressed as in FIG. 3 when showing the multilayer circuit board filter with an electrical equivalent circuit. The power-supply line including power input terminal 11, first power wiring conductor 21, first power via 31, and second power wiring conductor 22 and the ground line including input GND terminal 12, first GND wiring conductor 23, first GND via 32, and second GND wiring conductor 24 are parallel, are magnetically coupled by disposing especially first power via 31 and first GND via 32 close to each other, and operate as a common choke. With this, magnetic flux produced in both vias due to the current flowing in the power-supply line and the ground line is negated, but functions as inductance with respect to common-mode noise produced due to homopolarity in both lines with respect to a ground potential, and improves the common-mode noise reduction.

Figure 4A:
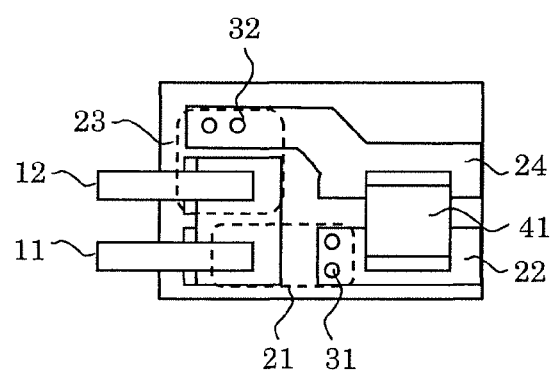
FIG. 4A is diagram showing another configuration example of the multilayer circuit board input filter according to Embodiment 2.
Figure 4B:
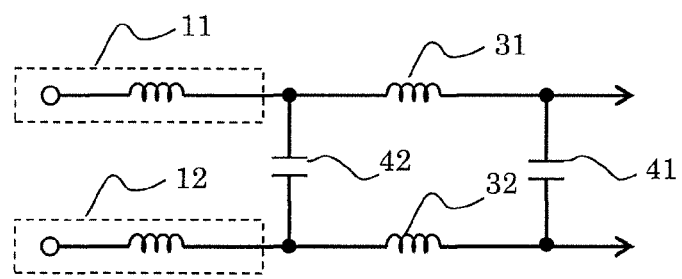
FIG. 4B is a diagram showing an equivalent circuit of the multilayer circuit board input filter in FIG. 4A.

Note that in FIG. 2, reducing the common-mode noise has been described from the point of view of the power-supply line and the ground line being parallel, but the component placement, wiring patterns, etc. may also be, for example, intentionally not parallel as in FIG. 4A so that each via and wiring conductor operate as inductors with respect to the line current. By doing so, the equivalent circuit becomes like the equivalent circuit in FIG. 4B and improves normal-mode noise reduction.

As described above, the filter according to Embodiment 2 includes: power input terminal 11 that extends from a front surface to a rear surface of multilayer circuit board 2 having at least two wiring layers; GND input terminal 12 that extends from the front surface to the rear surface of multilayer circuit board 2; first power wiring conductor 21 having an end connected to power input terminal 12 on the rear surface of multilayer circuit board 2; first GND wiring conductor 23 having an end connected to GND input terminal 12 and being parallel with first power wiring conductor 21 on the rear surface of multilayer circuit board 2; first power via 31 that extends from an other end of first power wiring conductor 21 to the front surface of multilayer circuit board 2; first GND via 32 that extends from an other end of first GND wiring conductor 23 to the front surface of multilayer circuit board 2; second power wiring conductor 22 having an end connected to first power via 31 on the front surface of multilayer circuit board 2; second GND wiring conductor 24 having an end connected to first GND via 32 and being parallel with second power wiring conductor 22 on the front surface of multilayer circuit board 2; and input capacitor 41 that includes a positive electrode and a negative electrode, the positive electrode being disposed on second power wiring conductor 22 and the negative electrode being disposed on second GND wiring conductor 24.

With this configuration, power input terminal 11, first power wiring conductor 21, first via 31, and second power wiring conductor 22 constitute the core of the power-supply line. GND input terminal 12, first GND wiring conductor 23, first GND via 32, and second GND wiring conductor 24 constitute the core of the GND line. This power-supply line and GND line are actively made to have parasitic inductance which improves common-mode noise reduction by magnetically coupling both lines.

The filter according to Embodiment 2 may also include second input capacitor 42 disposed on first wiring conductor 21, between input terminal 11 and first via 31.

This configuration makes it possible to include a n filter in the power-supply line and the GND line, and further improve noise reduction.

Embodiment 3

In the multilayer circuit board input filter in FIG. 2 described in the above Embodiment 2, second input capacitor 42 including the n filter can be omitted or have its electrostatic capacitance reduced due to the configuration described in Embodiment 3.

Figure 5:
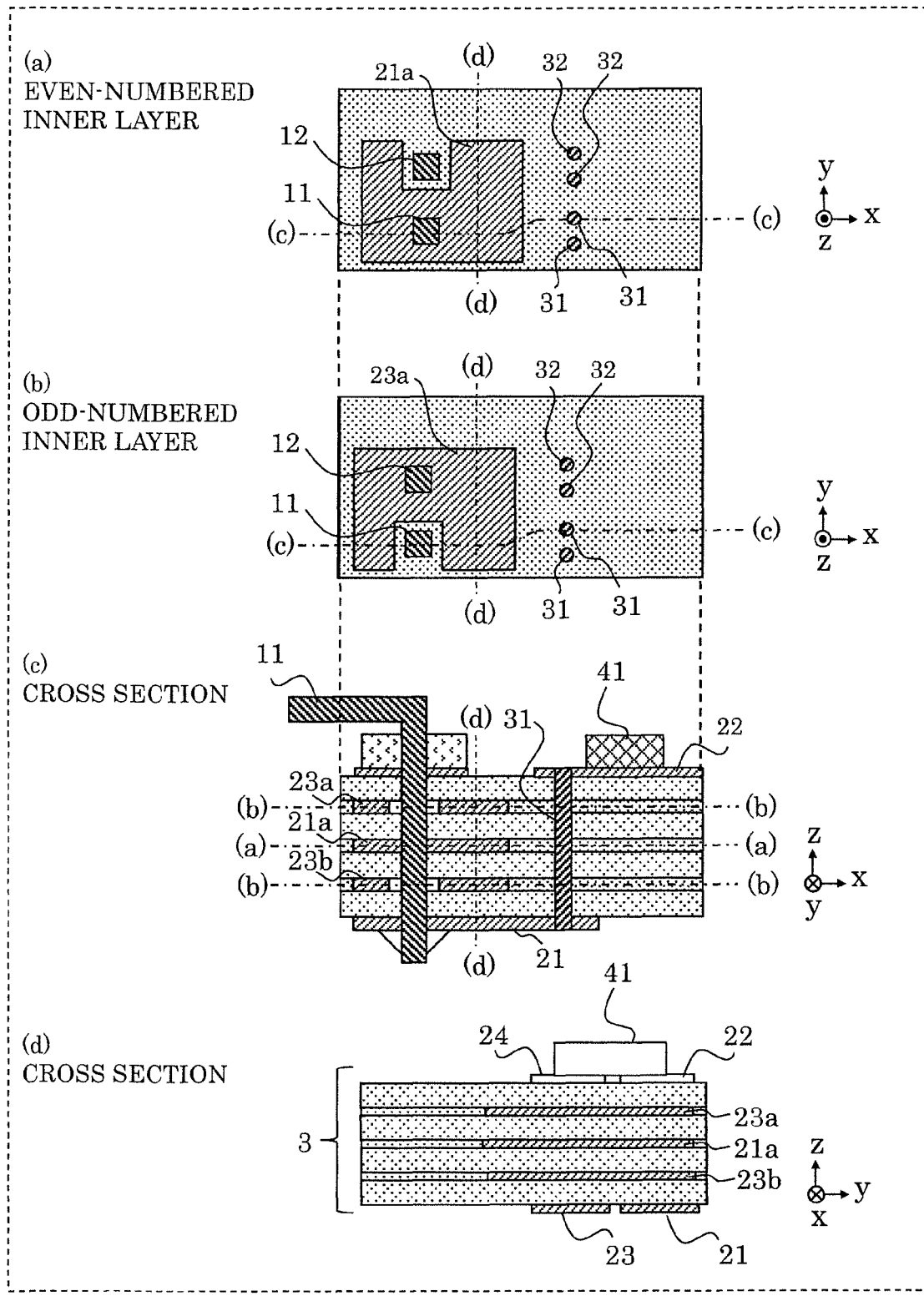
FIG. 5 is a diagram showing (a) even-numbered inner layer, (b) odd-numbered inner layer, (c) cross section, and (d) cross section in a configuration example of a multilayer circuit board input filter according to Embodiment 3.

FIG. 5 is a diagram showing (a) even-numbered inner layer, (b) odd-numbered inner layer, (c) cross section, and (d) cross section in a configuration example of a multilayer circuit board input filter according to Embodiment 3. In FIG. 5, the multilayer circuit board input filter is the same as the multilayer circuit board input filter according to Embodiment 2 shown in FIG. 2, and is therefore given the same reference numeral. A multilayer circuit board according to Embodiment 3 is named multilayer circuit board 3 to distinguish between the multilayer circuit board in FIG. 2. Multilayer circuit board 3 includes at least two wiring layers. The at least two wiring layers include at least one first inner layer and at least one second inner layer. In the configuration example of FIG. 5, multilayer circuit board 3 includes five wiring layers. The five wiring layers include a front surface wiring layer, a rear surface wiring layer, and three inner layers as the wiring layers.

The first inner layer includes power wiring conductor 21*a* connected to power input terminal 11, and corresponds to the even-numbered inner layer shown in (a) of FIG. 5.

The second inner layer includes GND wiring conductor 23*a* or 23*b* connected to GND input terminal 12, and corresponds to the odd-numbered inner layer shown in (b) of FIG. 5.

The at least one first inner layer and the at least one second inner layer are disposed alternatingly. A part of power wiring conductor 21*a* disposed on the first inner layer and a part of GND wiring conductor 23*a* or 23*b* disposed on the second inner layer face each other. Due to power wiring conductor 21*a* and GND wiring conductor 23*a* or 23*b* facing each other, the parasitic capacitance, i.e. a capacitor is formed, and can be made to have a capacitance value in accordance with the opposing areas.

The input filter in FIG. 5 differs in configuration from the input filter FIG. 2 in that the input filter does not include second input capacitor 42. In the even-number inner layers, power wiring conductor 21*a* is disposed connected to power input terminal 11 of the power-supply line. In the odd-numbered inner layers, GND wiring conductors 23*a* and 23*b* are disposed connected to GND input terminal 12 of the ground line. Each of these is printed so that they can take up a wide amount of opposing area permissible within the mounting space. This makes it possible to omit second input capacitor 42 or reduce its electrostatic capacitance since the parasitic capacitance is produced with the same amount between the opposing wiring conductors as second input capacitor 42 shown in Embodiment 3. The electrostatic capacitance value may be increased by also using second input capacitor 42.

Note that in order to easily understand the description by imagining a multilayer capacitor, the power ground wiring conductors are split up in even and odd numbers and disposed alternatingly, but the position of the input terminal, vertical orientation of the layers, etc. in this configuration are not limited, and any type of configuration for obtaining the parasitic electrostatic capacitance is viable.

As described above, in the filter according to Embodiment 3, the at least two wiring layers include at least one first inner layer (e.g. (a) in FIG. 5) and at least one second inner layer (e.g. (b) in FIG. 5). The at least one first inner layer includes power wiring conductor 21*a* connected to power input terminal 11. The at least one second inner layer includes GND wiring conductor 23*a* or 23*b* connected to GND input terminal 12. The at least one first inner layer and the at least one second inner layer are disposed alternatingly. A part of power wiring conductor 21*a* and a part of GND wiring conductor 23*a* or 23*b* face each other.

This configuration makes it possible to form a plate capacitor between power wiring conductor 21*a* and GND wiring conductor 23a or 23b disposed alternatingly, and since the plate capacitor can substitute the second input capacitor, it is possible to omit the second input capacitor or reduce its electrostatic capacitance.

Embodiment 4

Figure 6:
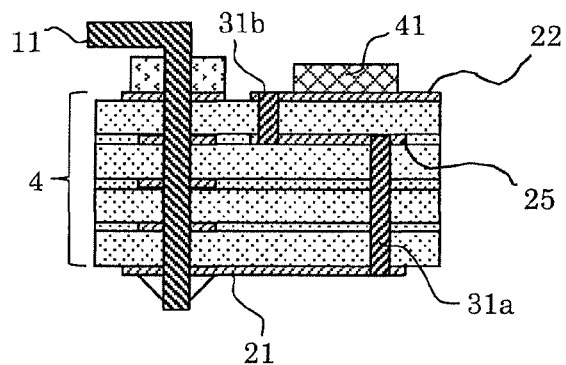
FIG. 6 is a cross-sectional view of a multilayer circuit board input filter according to Embodiment 4.

In Embodiment 4, a method will be described for increasing the parasitic inductance of the vias. FIG. 6 is a cross-sectional view of a multilayer circuit board input filter according to Embodiment 4. In FIG. 6, the multilayer circuit board input filter is the same as the multilayer circuit board input filter according to Embodiment 1 shown in FIG. 1, and is therefore given the same reference numeral. A multilayer circuit board according to Embodiment 4 is named multilayer circuit board 4 to distinguish between the multilayer circuit board in FIG. 1. The configuration differs from the configuration in FIG. 1 in that first wiring conductor 21 is longer, and that first via 31, which connects the first wiring conductor and second wiring conductor 22 on the front surface of the multilayer circuit board, is divided into multiple parts in the inner layers of the multilayer circuit board. In other words, first via 31 includes partial via 31a and partial via 31b connected in multiple steps via wiring conductor 25 in the at least one inner layer.

In FIG. 6, the fifth wiring conductor 25 is disposed in the inner layer proximate to the front surface of multilayer circuit board 4. First via 31 includes an 11th via (i.e., partial via 31a) and a 12th via (i.e., partial via 31b). The 11th via (partial via 31a) connects the end of first wiring conductor 21, which is longer than in FIG. 1, and the end of wiring conductor 25. The 12th via (partial via 31b) connects the other end of wiring conductor 25 and second wiring conductor 22. The connection position of the 12th via (partial via 31b) to second wiring conductor 22 is the same as in FIG. 1, but the 11th via (partial via 31a) is farther away from input terminal 11. In other words, the loop of input terminal 11→first wiring conductor 21→the 11th via (partial via 31a)→the fifth wiring conductor 25→the 12th via (partial via 31b)→second wiring conductor 22 covers more area than the loop of input terminal 11 to second wiring conductor 22 in FIG. 1.

As described above, the multilayer circuit board input filter according to Embodiment 4 makes it possible to enlarge the loop area and increase the inductance by dividing the vias, which include an inductor, in multiple parts, and the noise reduction can be improved by lowering the cutoff frequency using the LPF.

Note that in Embodiment 4, even though the loop area is enlarged, component mounting efficiency is not reduced due to the fifth wiring conductor 25 disposed in the inner layer and the first via group being disposed beneath first input capacitor 41.

The vertical position of the inner layers is optional and the loop may be enlarged as much as possible.

Note that increasing the inductance by enlarging the loop as described in Embodiment 4 can also be applied to the input filters described in the other embodiments to further improve the noise reduction.

As described above, in the filter according to Embodiment 4, the at least two wiring layers include at least one inner layer. First via 31 includes partial vias 31a and 31b connected in multiple steps via wiring conductor 25 in the at least one inner layer.

This configuration makes it possible to enlarge the loop area of input terminal 11, first wiring conductor 21, and partial vias 31a and 31b connected in multiple steps. In other words, the noise reduction can be improved by using a filter since the parasitic inductance from input terminal 11 to second wiring conductor 22 is actively increased.

Embodiment 5

In the above Embodiments 1 to 4, the multilayer circuit board input filter has been described, but improving the noise reduction is also possible with an output filter.

Figure 7A:
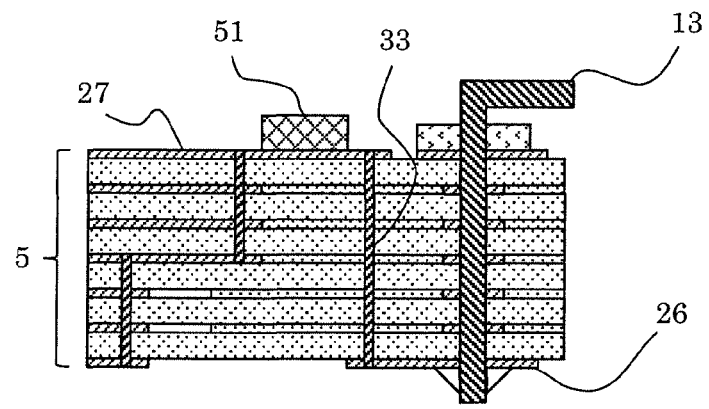
FIG. 7A is diagram showing a cross section in a configuration example of a multilayer circuit board output filter according to Embodiment 5.
Figure 7B:
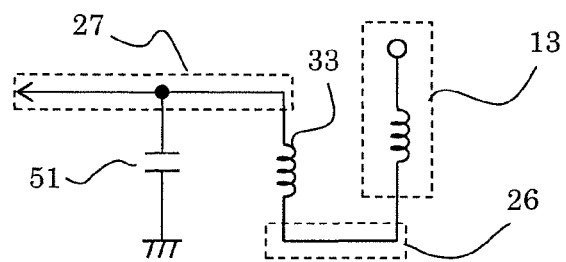
FIG. 7B is a diagram showing an equivalent circuit for describing electrical properties of the output filter in FIG. 7A.

FIG. 7A is diagram showing a cross section in a configuration example of a multilayer circuit board output filter according to Embodiment 5. FIG. 7B is a diagram showing an equivalent circuit for describing electrical properties of the output filter in FIG. 7A. The output filter in FIG. 7A is a filter circuit formed on multilayer circuit board 4, and includes output terminal 13, first wiring conductor 26, first via 33, second wiring conductor 27, and first output capacitor 51. This output filter is, for example, an LPF that reduces noise included in a power-supply voltage, and outputs the noise-reduced power-supply voltage from output terminal 13.

Multilayer circuit board 5 includes at least two wiring layers.

Output terminal 13 is inserted in a mounting hole from a front surface to a rear surface of multilayer circuit board 5, and outputs, for example, a power-supply voltage.

First wiring conductor 26 is printed on the rear surface of multilayer circuit board 5 and has an end soldered to output terminal 13.

First via 33 is disposed in an other end of first wiring conductor 26 on the rear surface of multilayer circuit board 5 and passes through the front surface of multilayer circuit board 5.

Second wiring conductor 27 is printed on the front surface of multilayer circuit board 5 and has an end connected to first via 33.

First output capacitor 51 includes first and second electrodes, the first electrode is connected to second wiring conductor 27, and the second electrode is grounded. Via first output capacitor 51, second wiring conductor 27 is wired to other inner layer wiring conductors through inner circuits, other vias, and the like. Output terminal 13 and first via 33 each include parasitic inductor, and as illustrated in the equivalent circuit of FIG. 7B, a CL filter is formed by first output capacitor 51.

With the above configuration, electric power output from the inner circuit is output through the parasitic inductors included in first via 33, output terminal 13, etc. after being collected in first output capacitor 51. Since a direct-current (DC) voltage output from output terminal 13 is supplied to the load via the capacitor disposed proximate to the load, the configuration is substantially a π filter and improves the noise reduction as an LPF.

As described above, the filter according to Embodiment 5 includes output terminal 13 that extends from the front surface to the rear surface of the multilayer circuit board having at least two wiring layers; first wiring conductor 26 having an end connected to output terminal 13 on the rear surface of the multilayer circuit board; first via 33 that extends from an other end of first wiring conductor 26 to the front surface of the multilayer circuit board; second wiring conductor 27 having an end connected to first via 33 on the front surface of the multilayer circuit board; and output capacitor 51 disposed on second wiring conductor 27.

This configuration makes it possible to form a filter while hardly increasing the footprint mainly due to the inductor included in the output terminal, the inductor included in the first via, and the first output capacitor. The parasitic capacitance is low since there are hardly any opposing sheet-shaped wiring patterns, and since the flowing current is collected in the second wiring conductor connected to a terminal of the output capacitor, the filter can reduce noise exceedingly effectively.

Embodiment 6

Figure 8:
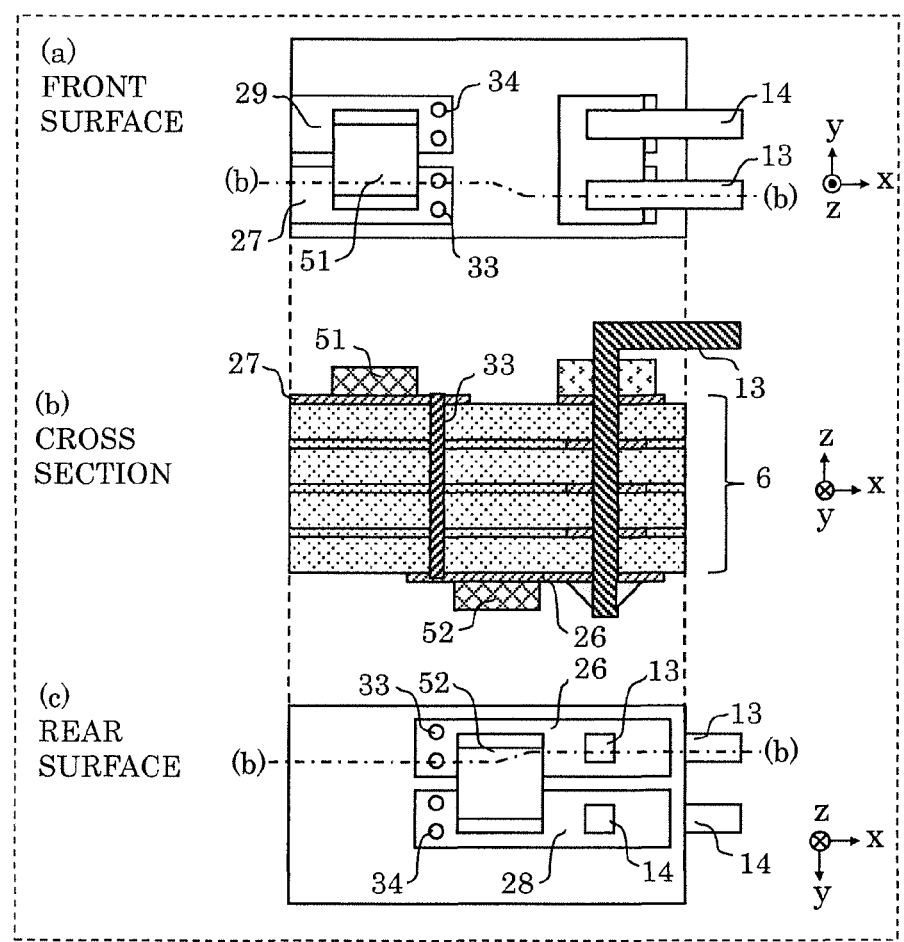
FIG. 8 is a diagram showing (a) front surface, (b) cross section, and (c) rear surface in a configuration example of a multilayer circuit board output filter according to Embodiment 6.
Figure 9:
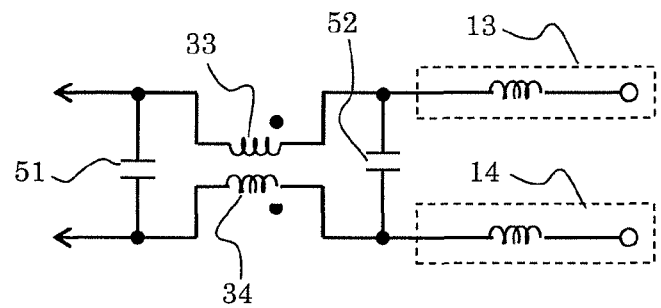
FIG. 9 is a diagram showing an equivalent circuit for describing electrical properties of the output filter in FIG. 8.

FIG. 8 is a diagram showing (a) front surface, (b) cross section, and (c) rear surface in a configuration example of a multilayer circuit board output filter according to Embodiment 6. FIG. 9 is a diagram showing an equivalent circuit for describing electrical properties of the output filter in FIG. 8. The output filter in FIG. 8 has the configuration of the input filter, which is applied to the input line of the multilayer circuit board in Embodiment 2 shown in FIG. 2, but applied to an output power-supply line and output ground line. In FIG. 8, the power output line is the same as the multilayer circuit board output filter according to Embodiment 5 shown in FIG. 7, and is therefore given the same reference numeral. A multilayer circuit board according to Embodiment 6 is named multilayer circuit board 6 to distinguish between the multilayer circuit board in FIG. 7A. Second output capacitor 52 is connected to first wiring conductor 26.

The output filter in FIG. 8 includes output terminal 13, first wiring conductor 26, first via 33, second wiring conductor 27, and first output capacitor 51 as components of the power-supply line. This output filter further includes GND output terminal 14, first GND wiring conductor 28, first GND via 34, and second GND wiring conductor 29 as components of the ground line. Hereinafter, in order to clearly distinguish the components of the power-supply line, output terminal 13 will be referred to as power output terminal 13, first wiring conductor 26 as first power wiring conductor 26, first via 33 as first power via 33, and second wiring conductor 27 as second power wiring conductor 27.

The output filter in FIG. 8 differs from the output filter in FIG. 7A in that the components of the ground line have been added. Hereinafter, the differences therefrom will be mainly described.

GND output terminal 14 is inserted in a mounting hole from a front surface to a rear surface of multilayer circuit board 6.

First GND wiring conductor 28 is printed on the rear surface of multilayer circuit board 6 and has an end soldered to GND output terminal 14.

First GND via 34 is disposed on an other end of first GND wiring conductor 28 on the rear surface of multilayer circuit board 6 and passes through the front surface of multilayer circuit board 6.

Second GND wiring conductor 29 is printed on the front surface of multilayer circuit board 6 and has an end connected to first GND via 34.

First output capacitor 51 includes the first electrode and the second electrode, the first electrode being disposed on second power wiring conductor 27, and the second electrode being disposed on second GND wiring conductor 29. Via first output capacitor 51, second GND wiring conductor 29 is wired to other inner layer wiring conductors through inner circuits, other vias, etc. In Embodiment 6, second output capacitor 52 is disposed, the first electrode of second output capacitor 52 is connected to second power wiring conductor 27, and the second electrode is connected to first GND wiring conductor 28. It will described later with reference to FIG. 9, but GND output terminal 14 and first GND via 34 each include a parasitic inductor, and a π filter is formed by first output capacitor 51, first power via 31, first GND via 34, and second output capacitor 52. In FIG. 8, first power via 33 and first GND via 34 are each disposed twice, but may be configured accordingly depending on the relationship between the ampacity of the vias and how high the current actually flowing therethrough is.

The above configuration enables the multilayer circuit board output filter in Embodiment 6 to be expressed as in FIG. 9 when showing the multilayer circuit board filter with an electrical equivalent circuit. The power-supply output line including power output terminal 13, first power wiring conductor 26, first power via 33, and second power wiring conductor 27 and the ground line including input GND output terminal 14, first GND wiring conductor 28, first GND via 34, and second GND wiring conductor 29 are parallel, are magnetically coupled by disposing especially first power via 33 and first GND via 34 close to each other, and operate as a common choke. With this, magnetic flux generated in both vias due to the current flowing in the power-supply line and the ground line is negated, but functions as inductance with respect to common-mode noise generated due to homopolarity in both lines with respect to a ground potential, and improves the common-mode noise reduction.

As described above, the filter according to Embodiment 6 includes: power output terminal 11 that extends from a front surface to a rear surface of the multilayer circuit board having at least two wiring layers; GND output terminal 14 that extends from the front surface to the rear surface of the multilayer circuit board; first power wiring conductor 26 having an end connected to power output terminal 14 on the rear surface of the multilayer circuit board; first GND wiring conductor 28 having an end connected to GND output terminal 14 and being parallel with first power wiring conductor 26 on the rear surface of the multilayer circuit board; first power via 33 that extends from an other end of first power wiring conductor 26 to the front surface of the multilayer circuit board; first GND via 34 that extends from an other end of first GND wiring conductor 28 to the front surface of the multilayer circuit board; second power wiring conductor 27 having an end connected to first power via 33 on the front surface of the multilayer circuit board; second GND wiring conductor 29 having an end connected to first GND via 34 and being parallel with second power wiring conductor 27 on the front surface of the multilayer circuit board; and output capacitor 51 that includes a first electrode and a second electrode, the first electrode being disposed on second power wiring conductor 27 and the second electrode being disposed on second GND wiring conductor 29.

With this configuration, the power-supply line and the GND line have inductance which improves common-mode noise reduction by magnetically coupling both lines.

The filter according to Embodiment 6 may also include second output capacitor 52 disposed on first wiring conductor 26, between output terminal 13 and first via 33.

With this structure, the power-supply line and the GND line form a π filter, and the noise reduction can be further improved.

Figure 10A:
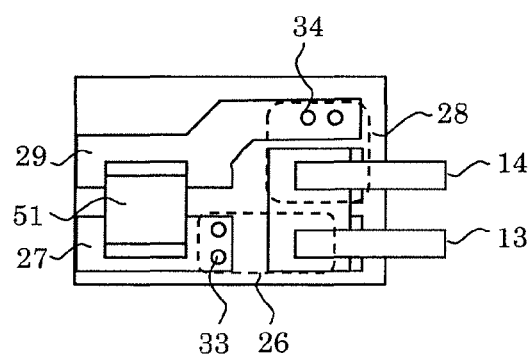
FIG. 10A is diagram showing the front surface in another configuration example of the multilayer circuit board output filter according to Embodiment 6.
Figure 10B:
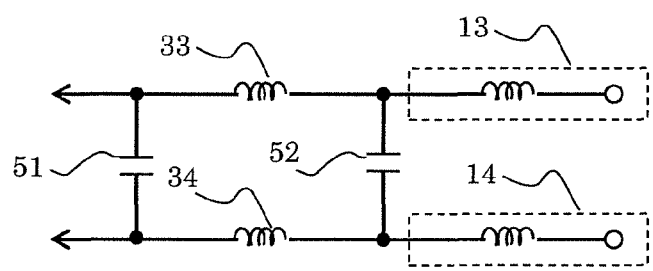
FIG. 10B is a diagram showing an equivalent circuit for describing electrical properties of the output filter in FIG. 10A.

Note that in FIG. 8, reducing the common-mode noise has been described from the point of view of the power-supply line and the ground line being parallel, but the component placement, wiring patterns, etc. may also be, for example, intentionally not parallel as in FIG. 10A so that each via, wiring conductor, etc. operate as inductors with respect to the line current. By doing so, the equivalent circuit is like the equivalent circuit in FIG. 10B and improves normal-mode noise reduction.

Embodiment 7

In the multilayer circuit board output filter in FIG. 8 described in the above Embodiment 6, second output capacitor 52 including the n filter can be omitted or have its electrostatic capacitance reduced due to the configuration described in Embodiment 7.

Figure 11:
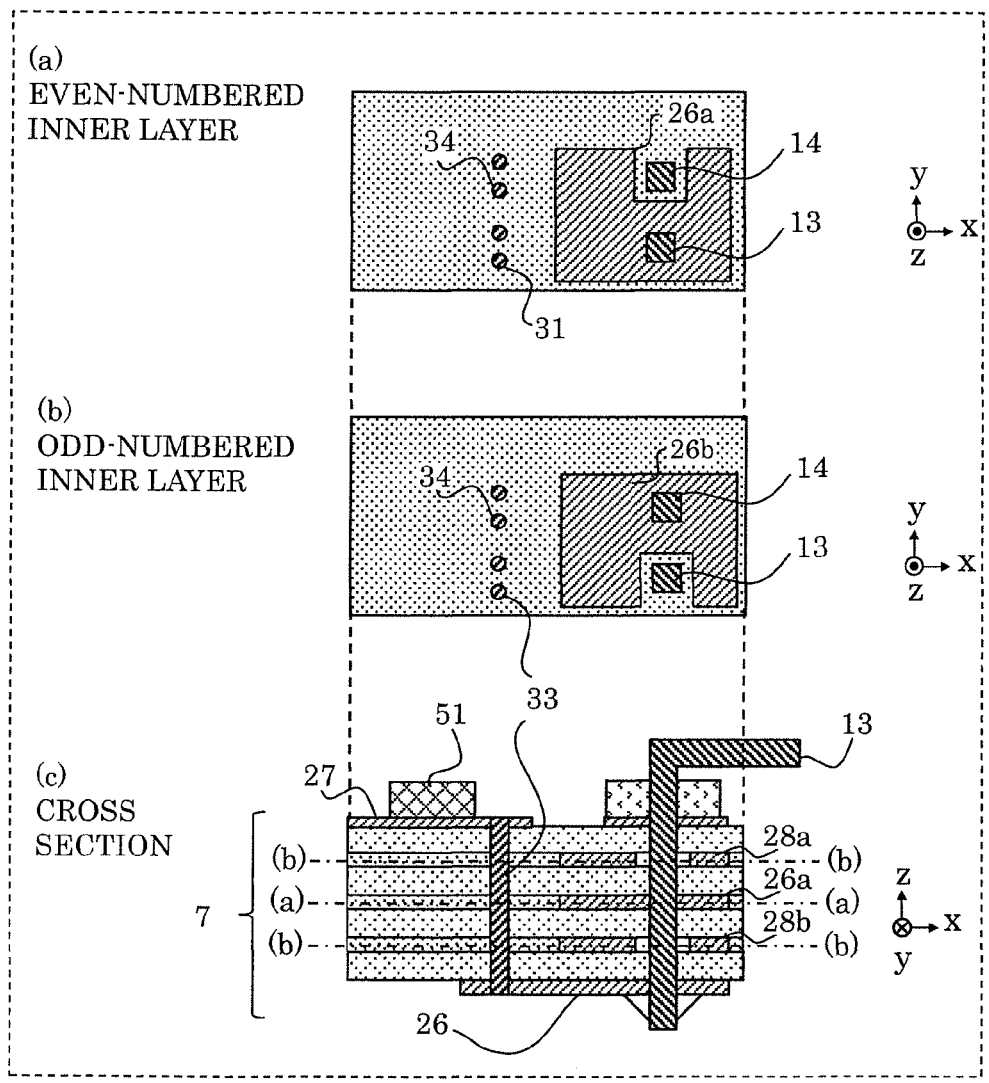
FIG. 11 is a diagram showing (a) even-numbered inner layer, (b) odd-numbered inner layer, and (c) cross section in a configuration example of a multilayer circuit board output filter according to Embodiment 7.

FIG. 11 is a diagram showing (a) even-numbered inner layer, (b) odd-numbered inner layer, and (c) cross section in a configuration example of a multilayer circuit board output filter according to Embodiment 7. In FIG. 11, the multilayer circuit board output filter is the same as the multilayer circuit board output filter according to Embodiment 6 shown in FIG. 8, and is therefore given the same reference numeral. A multilayer circuit board according to Embodiment 7 is named multilayer circuit board 7 to distinguish between the multilayer circuit board in FIG. 8. Multilayer circuit board 7 includes at least two wiring layers, at least one first inner layer and at least one second inner layer.

The first inner layer includes power wiring conductor 26a connected to power output terminal 13, and corresponds to the even-numbered inner layer shown in (a) of FIG. 11.

The second inner layer includes GND wiring conductor 28a or 28b connected to GND output terminal 14, and corresponds to the odd-numbered inner layer shown in (b) of FIG. 11.

The at least first inner layer and the at least one second inner layer are disposed alternatingly. A part of power wiring conductor 26a and a part of GND wiring conductor 28a or 28b face each other. By having power wiring conductor 26a and GND wiring conductor 28a or 28b face each other, parasitic capacitance, i.e. a capacitor is formed, and can be made to have a capacitance value in accordance with the opposing areas.

The output filter in FIG. 11 differs from the output filter FIG. 8 in that the output filter does not include second output capacitor 52. In the even-numbered inner layers, wiring conductor 26a is disposed connected to power output terminal 13. In the odd-numbered inner layers, GND wiring conductor 28a or 28b is disposed connected to GND output terminal 14 of the ground line. Each of these is printed so that they can take up a wide amount of opposing area permissible within the mounting space. This makes it possible to omit second output capacitor 52 or reduce its electrostatic capacitance since the parasitic capacitance is produced with the same amount between the opposing wiring conductors as second output capacitor 52 shown in Embodiment 6. The electrostatic capacitance value may be increased by also using second output capacitor 52.

As described above, in the filter according to Embodiment 7, the at least two wiring layers include at least one first inner layer (e.g. the even-numbered inner layer in FIG. 11) and at least one second inner layer (e.g. the odd-numbered inner layer in FIG. 11). The at least one first inner layer includes power wiring conductor 26a connected to power output terminal 13. The at least one second inner layer includes GND wiring conductor 28a or 28b connected to GND output terminal 14. The at least one first inner layer and the at least one second inner layer are disposed alternatingly. A part of power wiring conductor 26a and a part of GND wiring conductor 28a (or 28b) face each other.

This configuration makes it possible to form a plate capacitor between the power wiring conductor and the GND wiring conductor disposed alternatingly, and since the plate capacitor can substitute the second output capacitor, it is possible to omit the second output capacitor or reduce its electrostatic capacitance.

Note that in order to easily understand the description by imagining a multilayer capacitor, the power ground wiring conductors are split up in even and odd numbers and disposed alternatingly, but the position of the input terminal, vertical orientation of these layers, etc. in this configuration are not limited, and any type of configuration for obtaining the parasitic electrostatic capacitance is viable.

Embodiment 8

Figure 12:
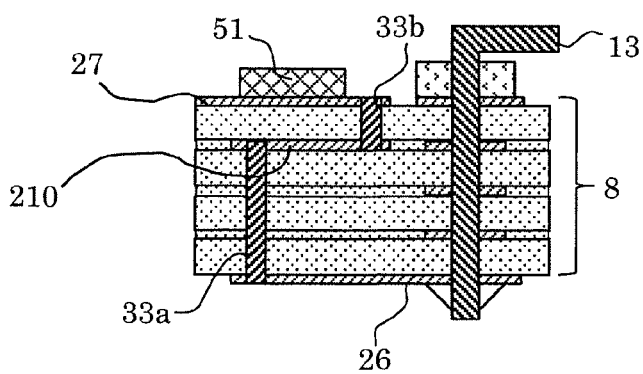
FIG. 12 is a cross-sectional view of a multilayer circuit board output filter according to Embodiment 8.

In Embodiment 8, a method is described for increasing the parasitic inductance of the vias. FIG. 12 is a cross-sectional view of a multilayer circuit board output filter according to Embodiment 8. In FIG. 12, the multilayer circuit board output filter is the same as the multilayer circuit board output filter according to Embodiment 5 shown in FIG. 7, and is therefore given the same reference numeral. A multilayer circuit board according to Embodiment 8 is named multilayer circuit board 8 to distinguish between the multilayer circuit board in FIG. 7. The configuration of the multilayer circuit board differs from its configuration in FIG. 7 in that first wiring conductor 26 is longer, and that first via 33, which connects first wiring conductor 26 and second ground wiring conductor 27 on the front surface of the multilayer circuit board, is divided into multiple parts in the inner layers of the multilayer circuit board. In other words, first power via 33 includes partial via 33a and partial via 33b connected in multiple steps via the inner layer wiring conductor 210.

In FIG. 12, wiring conductor 210 is disposed in the inner layer proximate to the front surface of multilayer circuit board 8. A first via (here, first power via 33) includes a 13th via (i.e., partial via 33a) and a 14th via (i.e., partial via 33b). The 13th via (partial via 33a) connects the end of first wiring conductor 26, which is longer than in FIG. 7, and the end of wiring conductor 210. The 14th via (partial via 33b) connects the other end of wiring conductor 210 and second wiring conductor 27. The connection position of the 14th via (partial via 33b) to second wiring conductor 27 is the same as in FIG. 7, but the 13th via (partial via 33a) is farther away from output terminal 13. In other words, the loop of output terminal 13→first wiring conductor 26→the 13th via (partial via 33a)→wiring conductor 210→the 14th via (partial via 33b)→second wiring conductor 27 covers more area than the loop of output terminal 13 to second wiring conductor 27 in FIG. 7.

As described above, the multilayer circuit board output filter according to Embodiment 8 makes it possible to enlarge the loop area and increase the inductance by dividing the vias, which include an inductor, in multiple parts, and the noise reduction can be improved by lowering the cutoff frequency using the LPF.

Note that in Embodiment 8, even though the loop area is enlarged, component mounting efficiency is not reduced due to wiring conductor 210 disposed in the inner layer and the third via group being disposed beneath first output capacitor 51.

The vertical position of the inner layers is optional and the loop may be enlarged as much as possible.

As described above, in the filter according to Embodiment 8, the at least two wiring layers include at least one inner layer. First via 33 includes partial vias 31a and 31b connected in multiple steps via wiring conductor 210 in the at least one inner layer.

This configuration makes it possible to improve the noise reduction using a filter since the inductance from the output terminal to the second wiring conductor is increased.

Note that increasing the inductance by enlarging the loop as described in Embodiment 8 can also be applied to the output filters described in the other embodiments to further improve the noise reduction.

Embodiment 9

As described in Embodiment 2 and Embodiment 6, the power ground line can be formed as a common choke by disposing the wiring conductors, vias, etc. parallel with and proximate to one another. By combining the methods for increasing the inductance by enlarging the loop area as described in Embodiment 4, Embodiment 8, etc., a common choke can be formed simply with the configuration of the vias and the wiring conductors in the multilayer circuit board.

Figure 13A:
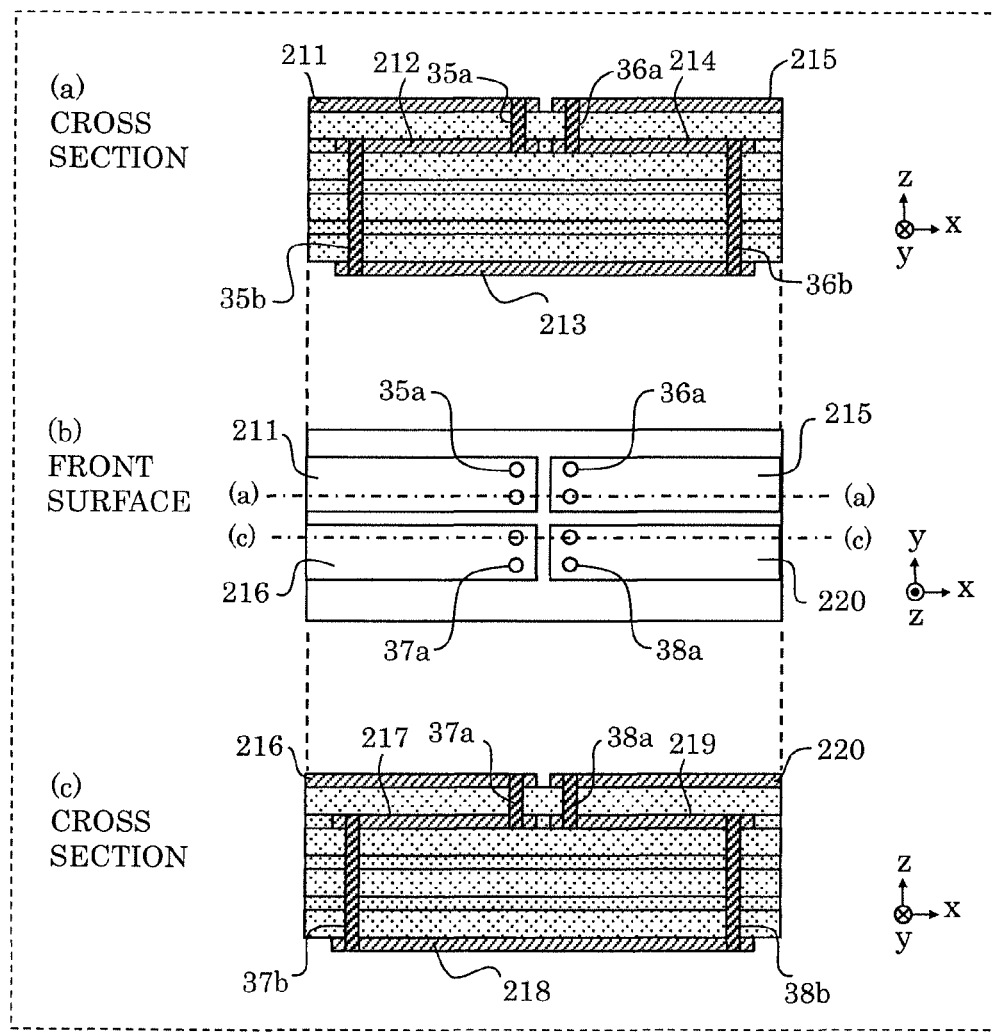
FIG. 13A is a diagram showing (a) cross section, (b) front surface, and (c) cross section in a configuration example of a multilayer circuit board filter according to Embodiment 9.
Figure 13B:
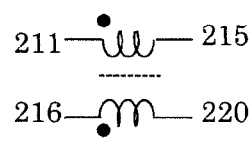
FIG. 13B is a diagram showing an equivalent circuit for describing electrical properties of the filter in FIG. 13A.

FIG. 13A is a diagram showing (a) cross section, (b) front surface, and (c) cross section in a configuration example of a multilayer circuit board filter according to Embodiment 9. FIG. 13B is a diagram showing an equivalent circuit for describing electrical properties of the filter in FIG. 13A.

In FIG. 13A, first power wiring conductor 211 is a power input line disposed on the front surface of the multilayer circuit board, and is connected at an end thereof to an end of a subsequent layer wiring conductor 212 via partial via 35a. The other end of wiring conductor 212 is connected to an end of second power wiring conductor 213 on the rear surface of the multilayer circuit board via partial via 35b. The other end of second power wiring conductor 213 is connected to an end of wiring conductor 214 disposed on the subsequent layer on the front surface of the multilayer circuit board via partial via 36b. The other end of wiring conductor 214 is connected to an end of third power wiring conductor 215, which is the power output line, disposed on the front surface of the multilayer circuit board via partial via 36a. However, first GND wiring conductor 216 is a GND input line disposed on the front surface of the multilayer circuit board, and is connected at an end thereof to an end of a subsequent layer wiring conductor 217 via partial via 37a. The other end of wiring conductor 217 is connected to an end of second GND wiring conductor 218 on the rear surface of the multilayer circuit board via partial via 37b. The other end of second GND wiring conductor 218 is connected to an end of wiring conductor 219 disposed on the subsequent layer on the front surface of the multilayer circuit board via partial via 38b. The other end of wiring conductor 219 is connected to an end of third GND wiring conductor 220, which is the GND output line, disposed on the front surface of the multilayer circuit board via partial via 38a.

As described above, along the parallel power and ground lines, the loop of both lines is magnetically coupled and a common choke can be formed with equal input and output polarity, as illustrated in the equivalent circuit, by having a configuration in which the loop runs from the front surface and returns back to the front surface via the rear surface using each of the vias. Since the loop area is enlarged more than when configured with regular vias passing through the front and rear surfaces, the inductance is also increased, and a common-mode filter with improved noise reduction effects can be obtained.

The vertical position of the inner layers is optional and the loop may be enlarged as much as possible.

As described above, the filter according to Embodiment 9 is a common-mode filter including first power wiring conductor 211 disposed on the front surface of the multilayer circuit board having at least one inner layer; first GND wiring conductor 216 being parallel with first power wiring conductor 211 on the front surface of the multilayer circuit board; the first power via having partial vias 35a, 35b connected in multiple steps and extending from the end of first power wiring conductor 211 to the rear surface of the multilayer circuit board via wiring conductor 212 disposed inside the at least one inner layer; the first GND via having partial vias 37a, 37b connected in multiple steps and extending from the end of first GND wiring conductor 216 to the rear surface of the multilayer circuit board via wiring conductor 217 disposed inside the at least one inner layer, and being parallel with the first power via; second power wiring conductor 213 having an end connected to the first power via on the rear surface of the multilayer circuit board; second GND wiring conductor 218 having an end connected to the first GND via and being parallel with second power wiring conductor 213; the second power via having partial vias 36a, 36b connected in multiple steps and extending from the end of second power wiring conductor 213 to the front surface of the multilayer circuit board via wiring conductor 214 disposed inside the at least one inner layer; the second GND via having partial vias 38a, 38b connected in multiple steps and extending from the end of second GND wiring conductor 218 to the front surface of the multilayer circuit board via wiring conductor 219 disposed inside the at least one inner layer, and being parallel with the second power via; third power wiring conductor 215 having an end connected to the second power via on the front surface of the multilayer circuit board; and third GND wiring conductor 220 having an end connected to the second GND via and being parallel with third power wiring conductor 215 on the front surface of the multilayer circuit board.

This configuration makes it possible to obtain a common-mode filter with high inductance since the parallel power wiring and GND wiring make a loop with the inner layer wiring conductors.

Note that increasing the inductance by enlarging the loop as described in Embodiment 9 can also be applied to the output filters described in the other embodiments to further improves the noise reduction.

Embodiment 10

Figure 14A:
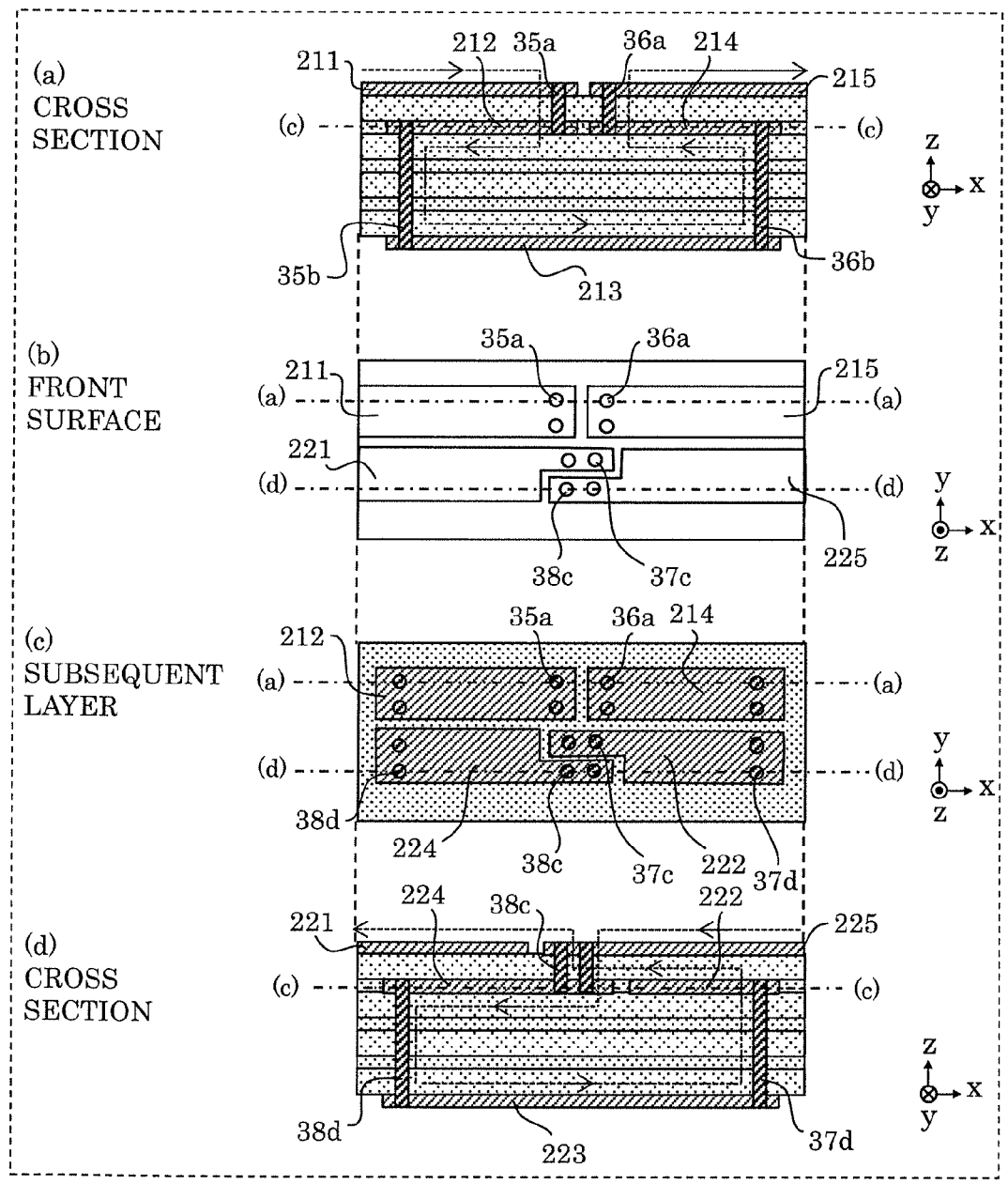
FIG. 14A is a diagram showing (a) cross section, (b) front surface, (c) subsequent layer, and (d) cross section in a configuration example of a multilayer circuit board filter according to Embodiment 10.
Figure 14B:
FIG. 14B is a diagram showing an equivalent circuit for describing electrical properties of the filter in FIG. 14A.
Figure 14B:
Figure 15:
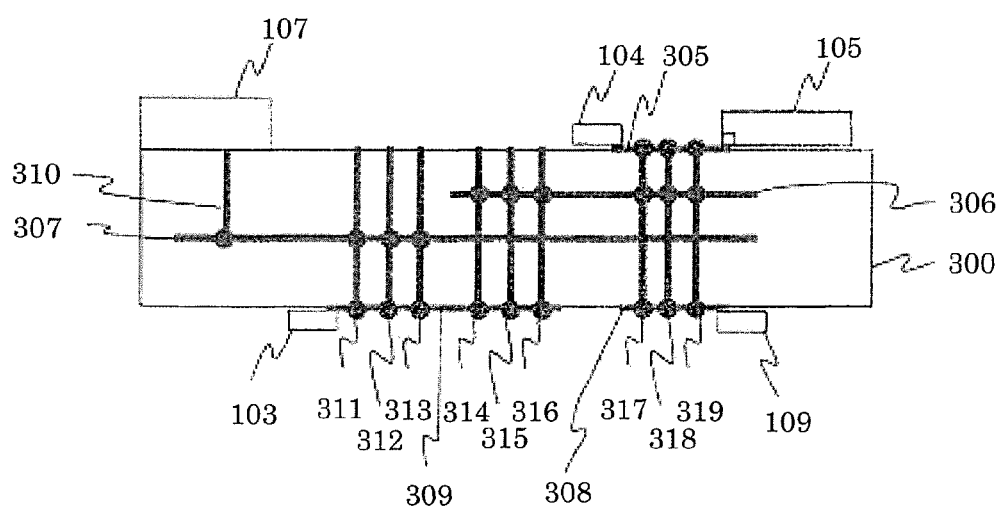
FIG. 15 is a cross-sectional view of a conventional multilayer PCB.

In contrast with the common choke shown in Embodiment 8, a normal choke configuration is also possible. FIG. 14A is a diagram showing (a) cross section, (b) front surface, (c) subsequent layer, and (d) cross section in a configuration example of a multilayer circuit board filter according to Embodiment 10. FIG. 14B is a diagram showing an equivalent circuit for describing electrical properties of the filter in FIG. 14A. In FIG. 14, the configuration from first power wiring conductor 211, which is the power input line, to third power wiring conductor 215, which is the power output line, is similar to the configuration in Embodiment 9 shown in FIG. 13A, and description thereof is thus omitted. Since the drawings will become too complicated, the reference numerals of the vias along the power-supply line are also omitted. The configuration in FIG. 14A differs from the configuration in FIG. 13A in that the configuration of the ground line is different.

In FIG. 14A, first GND wiring conductor 221 is a GND input line disposed on the front surface of the multilayer circuit board, and is connected at an end thereof to an end of a subsequent layer wiring conductor 222 via partial via 37c. Wiring conductor 222 differs from the power-supply line, is wired to the output side, and the other end of wiring conductor 222 is connected to an end of second GND wiring conductor 223 on the rear surface of the multilayer circuit board via partial via 37d. The end of second GND wiring conductor 223 is, therefore, also disposed on the output side, wired to the input side, and the other end of second GND wiring conductor 223 disposed on the input side is connected to an end of wiring conductor 224 disposed on the subsequent layer on the front surface of the multilayer circuit board via partial via 38d. The other end of wiring conductor 224 is connected to an end of third GND wiring conductor 225, which is the GND output line, disposed on the front surface of the multilayer circuit board via partial via 38c.

As described above, along the parallel power and ground lines, the loop of both lines is magnetically coupled and a normal choke can be formed in which the input and output polarity is inverted, as illustrated in the equivalent circuit, by having a configuration in which the polarity of the loop is inverted while running from the front surface and returning back to the front surface via the rear surface using each of the vias. With the common choke, the magnetic flux produced due to the current flowing in the power-supply line and the ground line is negated, but functions as inductance with respect to common-mode noise generated due to the homopolarity in both lines with respect to the ground potential, and improves the common-mode noise reduction. In contrast, since the normal choke strengthens the magnetic flux produced due to the current flowing in the power-supply line and the ground line, the normal choke functions as an inductor with respect to the common-mode noise produced between the power-supply line and the ground line, and improves the normal-mode noise reduction.

The vertical position of the inner layers is optional and the loop may be enlarged as much as possible.

As described above, the filter according to Embodiment 10 is a normal-mode filter (i) including first power wiring conductor 211 disposed on the front surface of the multilayer circuit board having at least one inner layer; first GND wiring conductor 221 being parallel with first power wiring conductor 211 on the front surface of the multilayer circuit board; the first power via having partial vias 35a, 35b connected in multiple steps and extending from the end of first power wiring conductor 211 to the rear surface of the multilayer circuit board via wiring conductor 212 disposed inside the at least one inner layer; the first GND via having partial vias 37c, 37d connected in multiple steps and extending from the end of first GND wiring conductor 221 to the rear surface of the multilayer circuit board via wiring conductor 222 disposed inside the at least one inner layer; second power wiring conductor 213 having an end connected to the first power via on the rear surface of the multilayer circuit board; second GND wiring conductor 223 having an end connected to the first GND via and being parallel with second power wiring conductor 213; the second power via having partial vias 36a, 36b connected in multiple steps and extending from the end of second power wiring conductor 213 to the front surface of the multilayer circuit board via wiring conductor 214 disposed inside the at least one inner layer; the second GND via having partial vias 38d and 38c connected in multiple steps and extending from the end of the second GND wiring conductor to the front surface of the multilayer circuit board via wiring conductor 224 disposed inside the at least one inner layer; third power wiring conductor 215 having an end connected to the second power via on the front surface of the multilayer circuit board; and third GND wiring conductor 225 having an end connected to the second GND vias 38c and 38c, and being parallel with third power wiring conductor 215 on the front surface of the multilayer circuit board, and (ii) in which the first power via and the second GND via are parallel, and the second power via and the first GND via are parallel.

This configuration makes it possible to obtain a normal-mode filter with high inductance since the parallel power wiring and GND wiring make a loop using the inner layers wiring conductors.

Note that increasing the inductance by enlarging the loop as described in Embodiment 10 can also be applied to the output filters described in the other embodiments to further improve the noise reduction.

A specific configuration has been omitted in the present specification, but it is possible to increase magnetic permeability in the loop of the inductor using the vias and thus further increase the inductance by, for example, using ferromagnetic material in a portion of the inner layers of the multilayer circuit board, a portion of the wiring conductors printed on the inner layers, etc.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

As described above, the present disclosure can be used for a high-frequency noise-reducing filter in a multilayer circuit board in order to make various electronic devices smaller.

What is claimed is:

1. A filter which is formed on a multilayer printed circuit board (PCB) having at least two wiring layers, the filter being wired to an inner circuit, the filter comprising:
   a mounting hole passing through the multilayer PCB from a front surface to a rear surface of the multilayer PCB;
   an input terminal that is a conductor passing through the mounting hole and comprises a first protruding portion protruding from the front surface of the multilayer PCB and a second protruding portion protruding from the rear surface of the multilayer PCB, the second protruding portion being connected to the multilayer PCB by a solder;
   a first wiring conductor which is a belt-shaped wiring conductor having a first end portion and a second end portion, the first end portion being connected to the first protruding portion of the input terminal, the first wiring conductor being disposed on the rear surface of the multilayer PCB;
   a first via connector that passes through the multilayer PCB and is connected the second end portion of the first wiring conductor;
   a second wiring conductor which is a belt-shaped wiring conductor having a third end portion and a fourth terminal connected to the inner circuit, the third end portion being connected to the first via connector, without being directly connected to the input terminal, the second wiring conductor being disposed on the front surface of the multilayer PCB; and
   a first input capacitor including a first electrode and a second electrode, the first electrode being disposed on and connected to the second wiring conductor, and the second electrode being electrically grounded, wherein:
   the third end portion of the second wiring conductor, a connection portion between the second wiring conductor and the first electrode of the first input capacitor, and a connecting portion between the second wiring conductor and the inner circuit are aligned on the second wiring conductor in this order along a longitudinal direction of the second wiring conductor, and the input terminal and the first via connector include parasitic inductors connected in series, and the parasitic inductors and the first input capacitor constitute an LC circuit of the filter, and the inner circuit is not connected to the first wiring conductor.

2. The filter according to claim 1, comprising:
a second input capacitor disposed on the first wiring conductor, between the input terminal and the first via connector.

3. The filter according to claim 1, comprising:
at least one inner layer included in the multilayer PCB having the at least two wiring layers, wherein
the first via connector includes a plurality of partial via connectors connected in multiple steps through a wiring conductor in the at least one inner layer.

\* \* \* \* \*